United States Patent
Salleh

(10) Patent No.: US 7,822,579 B2
(45) Date of Patent: Oct. 26, 2010

(54) INTERFERENCE REJECTION THROUGH CIRCLE FITTING

(75) Inventor: Akmarul Ariffin Bin Salleh, Penang (MY)

(73) Assignee: Agilent Technologies, Inc., Santa Clara, CA (US)

( * ) Notice: Subject to any disclaimer, the term of this patent is extended or adjusted under 35 U.S.C. 154(b) by 285 days.

(21) Appl. No.: 12/017,063

(22) Filed: Jan. 21, 2008

(65) Prior Publication Data

US 2009/0187362 A1 Jul. 23, 2009

(51) Int. Cl.
*H04B 15/00* (2006.01)

(52) U.S. Cl. .................. 702/191; 702/70; 324/623; 324/628; 324/76.12

(58) Field of Classification Search .............. 702/57, 702/64–67, 69, 70, 74, 189–191; 324/543, 324/620, 623, 626, 628, 76.12, 76.13, 76.38
See application file for complete search history.

(56) References Cited

U.S. PATENT DOCUMENTS

2003/0222654 A1* 12/2003 Furse et al. ............... 324/543

* cited by examiner

*Primary Examiner*—Manuel L Barbee
(74) *Attorney, Agent, or Firm*—Marc Bobys

(57) ABSTRACT

A method and apparatus for measuring electrical signals measures an electromagnetic wave having an interference component at a center frequency and at multiple times to obtain data points. The positions of the data points on a complex plane are calculated. Chords of a circle on the complex plane, wherein the chords passing between pairs of the data points, and the circle fit to the data points are calculated. The chords are used to determine an approximate center of the circle wherein the position of the approximate center of the circle on the complex plane represents the electromagnetic wave with the interference component removed. An indication of the measured electromagnetic wave having the interference component removed is output from the apparatus.

18 Claims, 8 Drawing Sheets

INTERFERENCE REJECTION THROUGH CIRCLE FITTING

BACKGROUND OF THE INVENTION

RF instruments for measuring the voltage standing wave ratio ("Γ") of a cable are known in the art.

The standing wave ratio ("Γ") is given by:

$$\Gamma = A/R$$

where "A" is the reflected signal and "R" is the incident signal. Both the signals "A" and "R" are vectors. Ideally, at one particular frequency point for a given device under test, the ratio "A/R" will have a fixed magnitude and a fixed angle.

In some test setups, however, there may be unwanted interference. The unwanted interference may affect the accuracy of the Γ measurement. Due to the interference, the Γ measurement may vary with time even at a fixed frequency of the RF source for the Γ measurement. It would be desirable to be able to remove this unwanted interference from the measurement to provide an accurate measurement of Γ.

SUMMARY OF THE INVENTION

The present invention provides interference rejection in VSWR ("Γ") measurements through circle fitting to provide an accurate measurement of Γ.

In general terms, the invention is a method and apparatus for measuring electrical signals, and more particularly for measuring Γ. The method can comprise the steps of: measuring an electromagnetic wave having an interference component at a center frequency and at multiple times to obtain data points; calculating the positions of the data points on a complex plane; calculating chords of a circle on the complex plane, the chords passing between pairs of the data points, and the circle fit to the data points; using the chords to determine an approximate center of the circle wherein the position of the approximate center of the circle on the complex plane represents the electromagnetic wave with the interference component removed; and outputting an indication of the measured electromagnetic wave having the interference component removed.

The apparatus measures an electromagnetic wave having an interference component at a center frequency and at multiple times to obtain data points. The positions of the data points on a complex plane are calculated. Chords of a circle on the complex plane, wherein the chords passing between pairs of the data points, and the circle fit to the data points are calculated. The chords are used to determine an approximate center of the circle wherein the position of the approximate center of the circle on the complex plane represents the electromagnetic wave with the interference component removed. An indication of the measured electromagnetic wave having the interference component removed is output from the apparatus.

BRIEF DESCRIPTION OF THE DRAWINGS

Further preferred features of the invention will now be described for the sake of example only with reference to the following figures, in which.

DETAILED DESCRIPTION

Figure 1:
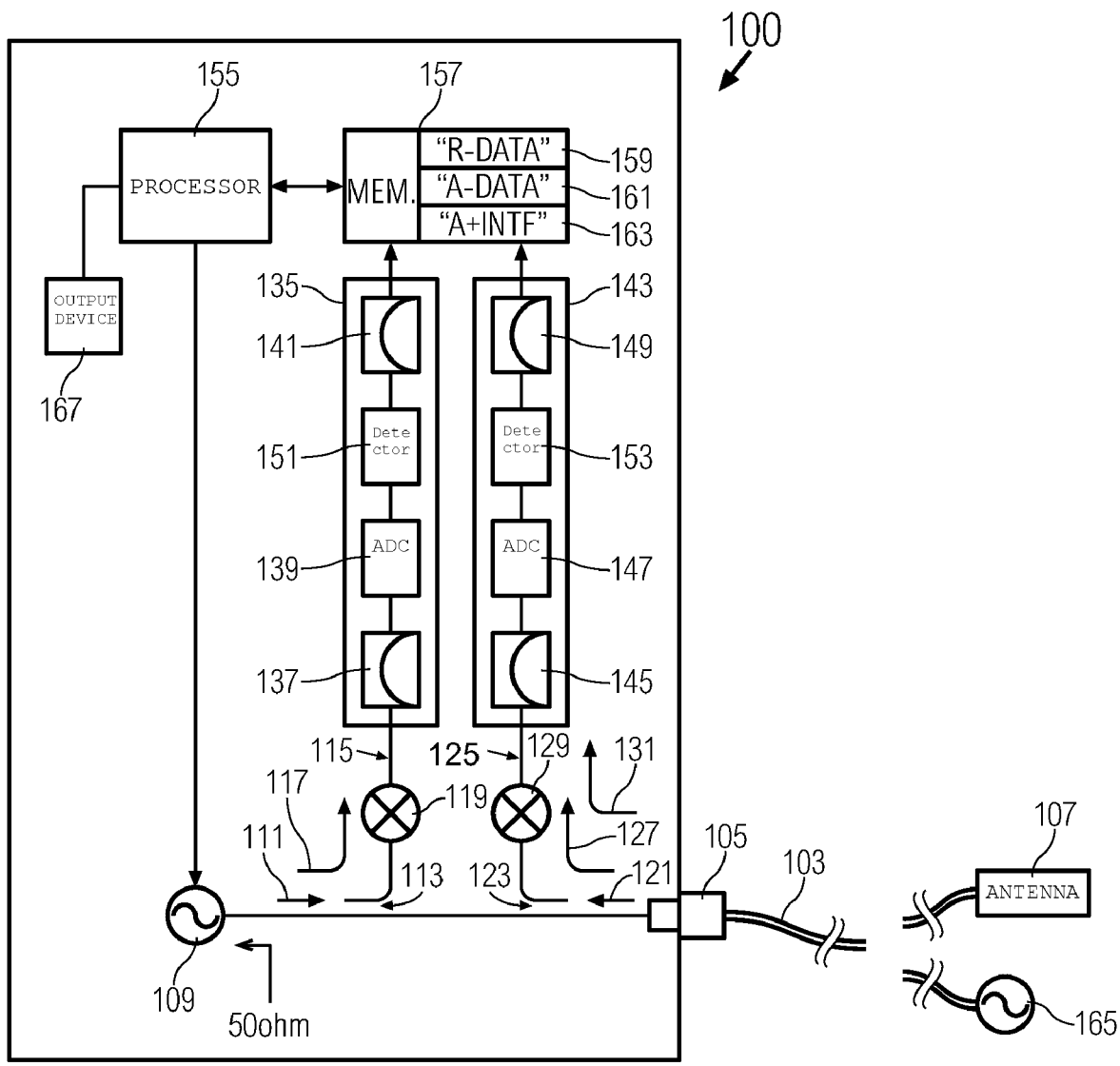
FIG. 1 shows a semi-diagrammatic view of a setup of a Γ measurement instrument used to perform a Γ measurement with interference rejection of the present invention.

FIG. 1 shows a semi-diagrammatic view of a setup of a Γ measurement instrument 100 used to perform a Γ measurement with interference rejection of the present invention.

The instrument 100 is shown connected to a cable under test 103 for performing the Γ measurement. In addition to a cable under test, other types of devices can be tested with this instrument 100. The other types of devices could be active or passive and might include microstrip filters, amplifiers, or others as would be appreciated by those skilled in the art.

One end of the cable under test 103 is connected to a test port 105 of the Γ measurement instrument 100. Another end of the cable under test 103 can be connected to an antenna 107. This antenna 107 may pick up unwanted interference. Alternatively, rather than an antenna, the cable under test 103 may happen to be connected to another source of interference. For example, when the device under test is a microstrip filter on a printed circuit board ("PCB"), the filter itself can pick up unwanted interference and effect the Γ measurement.

The Γ measurement instrument 100 includes an RF source 109 for supplying an RF source signal 111 to the cable under test 103. The RF frequency range is considered to cover frequencies from approximately 150 kHz up to the infrared ("IR") range, however, embodiments of the invention can also cover frequencies down to below 10 kHz or above the IR range. In other embodiments the frequency can be limited to the microwave frequency range of 1 GHz and higher or the frequency can be limited to the optical range. In general the invention can be used at any useful electromagnetic frequency range.

The RF source 109 is a 50 ohm match to the impedance of the Γ measurement instrument 100. Other impedance matches are possible in embodiments in which the transmission media used is other types of cable, waveguide, or other media.

An incident wave coupler 113 couples a portion of the source signal 111 to an incident channel 115 as an incident signal ("R") 117. An incident-channel mixer 119 downconverts the "R" signal 117 to a lower frequency for signal processing.

After the incident-channel mixer 119 is a receiver chain 135. The receiver chain 135 includes an anti-aliasing filter 137 to reduce aliasing effects, an analog-to-digital converter ("ADC") 139, a detector 151 and a digital filter 141.

A reflected wave coupler 123 couples a portion of a reflected wave 121 reflected from the cable under test 103 to a reflected channel 125 as a reflected signal ("A") 127. The reflected wave coupler 123 also couples a portion of an unwanted interference signal or interference component 131 from the antenna 107 or other source of interference.

A reflected-channel mixer 129 downconverts the "A" signal 127 to a lower frequency for signal processing. A receiver chain 143, similar the receiver chain 135, is positioned after the reflected-channel mixer 129 and includes an anti-aliasing filter 145, an ADC 147, a detector 153 and a digital filter 149.

The frequency of the desired reflected signal or center frequency "A" 127 and incident signal "R" 117 are always tuned at the center of the anti-alias filters 137, 145 and the digital filters 141, 149 of the receiver chains 135, 143, respectively. The digital filters 141, 149 have the narrower bandwidth and thus determine the system bandwidth or measurement bandwidth of the Γ measurement instrument 100.

The receiver chain 135 of the incident channel 115 is for measuring the "R" signal 117 and the receiver chain 143 of the reflected channel 125 is for measuring the "A" signal 127. The "A" and "R" measurements can be controlled by one or more processors 155. The "A" and "R" measurement data can be stored in a computer readable media 157 as "A" data 161 and "R" data 159. The detectors 151, 153 can be IQ mixers, implemented in a FPGA for detecting the magnitude and phase of the digital signals from the ADCs 139, 147, for example. The processor can be a computer, CPU or other type of processor. The computer readable media 157 can be a hard drive, RAM, ROM, firmware, CD or other type of storage.

Figure 2:
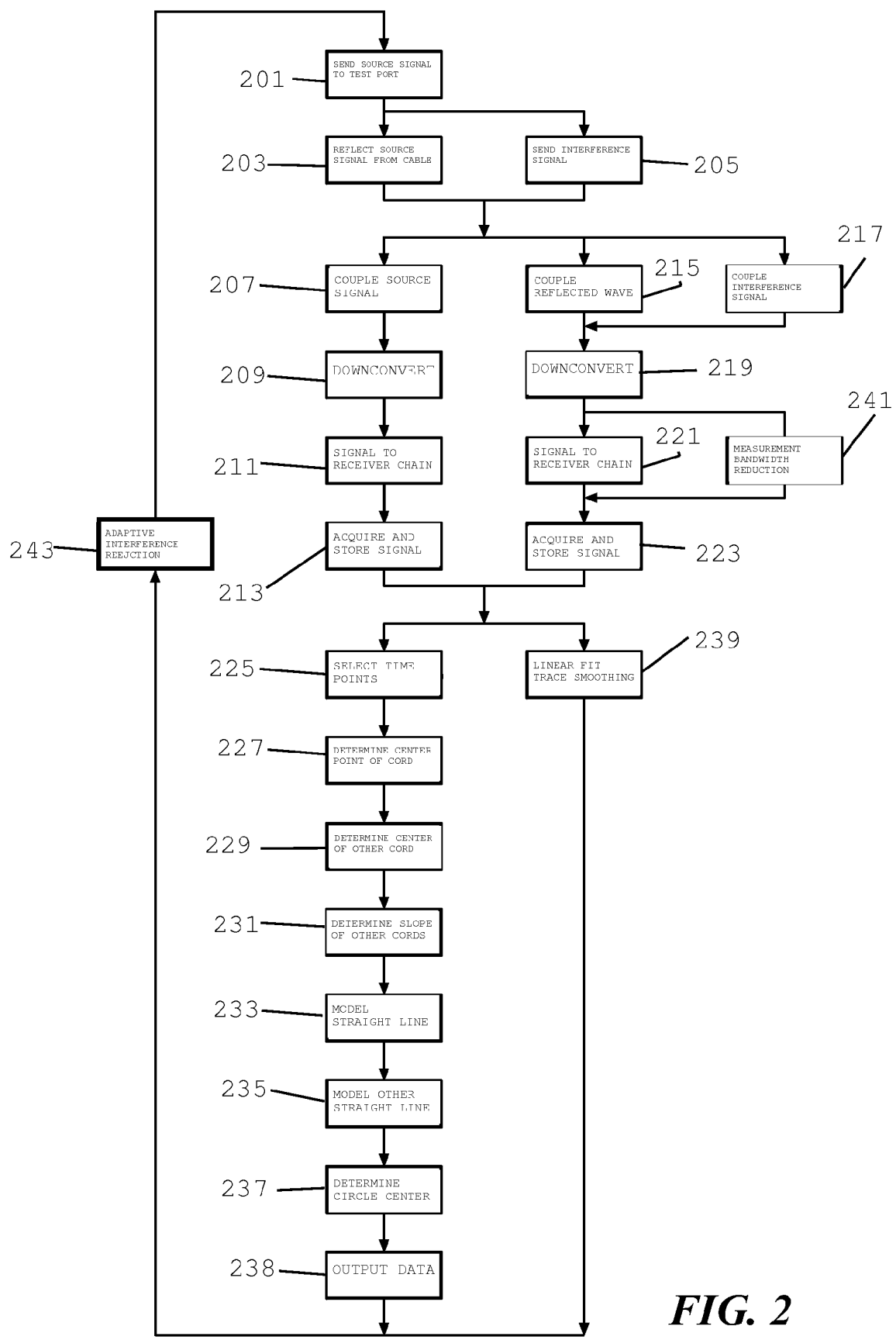
FIG. 2 shows a flowchart for a method of performing the Γ measurement with interference rejection of the present invention.

FIG. 2 shows a flowchart for a method 200 of performing the Γ measurement with interference rejection of the present invention.

At Step 201 the RF source 109 sends the RF source signal 111 through the incident wave coupler 113, through the reflected wave coupler 123 to exit the Γ measurement instrument 100 through the test port 105.

At Step 203 a portion of the RF source signal 111 is reflected from the cable under test 103 back through the test port 105 as the reflected wave 121.

At Step 205 the antenna 107 or other source of interference also sends interference into the Γ measurement instrument 100 through the test port 105.

At Step 207 the incident wave coupler 113 couples a portion of the source signal 111 to the incident channel 115 as the "R" signal 117.

At Step 209 the incident-channel mixer 119 downconverts the "R" signal 117 to a lower frequency for signal processing.

At Step 211 the "R" signal 117 leaves the incident-channel mixer 119 and enters the receiver chain 135. The signal passes through the anti-aliasing filter 137 where aliasing effects are reduced. The signal also passes through the "ADC" 139, the detector 151 and the digital filter 141 of the receiver chain 135.

At Step 213 the processor 155 acquires the "R" signal 117 and stores the "R" measurement data on the computer readable media 157 as "R" data 159.

At Step 215 the reflected wave coupler 123 couples a portion of the reflected wave 121 to the reflected channel 125 as the "A" signal 127.

At Step 217 the reflected wave coupler 123 also couples a portion of the interference signal 131 from the antenna 107 or other source of interference.

At Step 219 the reflected-channel mixer 129 downconverts the "A" signal 127 (and also, if present, the interference signal 131) to a lower frequency for signal processing.

At Step 221 the "A" signal 127 (and also, if present, the interference signal 131) leaves the reflected-channel mixer 129 and enters the receiver chain 143. The signal passes through the anti-aliasing filter 145 where aliasing effects are reduced. The signal also passes through the "ADC" 147, the detector 153 and the digital filter 149 of the receiver chain 143.

Also at Step 221, the "A" signal 127 is detected by the detector 153 of the reflected channel 125.

At Step 223 the processor 155 acquires the "A" signal 127 and stores the "A" measurement data on the computer readable media 157 as "A" data 161 (and also, if present, the sum of the "A" signal 127 and the interference signal 131 ("Intf"), "A+Intf"). The interference signal 131 passing through receiver chain 143 for having it's data stored on the computer readable media 157 will not have a significant amplitude if it's frequency lies outside of the bandwidth of the digital filter 149.

Without the unwanted interference 131 introduced by the antenna 107 or other source of interference, the Γ measurement instrument 100 of FIG. 1 measures the standing wave ratio ("Γ") as:

$$\Gamma = A/R$$

where "A" is the "A" signal 127 reflected from the cable under test 103 and measured by the detector 153 and "R" is the signal incident into the cable. Both the signals "A" and "R" are vectors. At one particular frequency point for a given device under test, and without interference, the ratio "A/R" will have a fixed magnitude and a fixed angle.

When the unwanted interference signal 131 is present, it is downconverted by the reflected-channel mixer 129. After downconversion, the interference signal 131 passes through the receiver chain 143, including the anti-aliasing filter 145, the ADC 147, the detector 153, and the digital filter 149.

If the downconverted signal lies outside the bandwidth of the digital filter 149, the interference signal 131 will have no effect on the VSWR "Γ" and the equation Γ=A/R will be valid so long as the interference signal 131 does not compress the reflected-channel mixer 129.

When the unwanted interference signal 131 is present and the downconverted signal lies inside the bandwidth of the digital filter 149, the detector 153 of the reflected channel 125 measures the sum of the "A" signal 127 and the interference signal 131 ("Intf"), "A+Intf". This sum measurement data can be stored in the computer readable media 157 as "A+Intf" data 163.

Thus the VSWR "Γ" will no longer be equal to a ratio "A/R" having a fixed magnitude and a fixed angle at a particular signal frequency. Rather, at a fixed frequency Γ will vary with time due to the interference.

The "A" signal 127 and the interference signal 131 ("Intf"), both vectors, will add in phase and out of phase thus corrupting the Γ measurement. The Γ is then defined by the more general ratio:

$$\Gamma = (A+Intf)/R$$

$$\Gamma = (A/R) + (Intf/R)$$

The interference signal 131 ("Intf") will also leak by a small amount into to the incident-channel mixer 119, depending on the actual match looking into the RF source 109. The equation Γ=(A+Intf)/R will remain valid so long as the magnitude of the interference signal 131 is kept below a threshold value and does not compress the reflected-channel mixer 129.

The present invention extracts the term "Intf/R" to be able to determine the value of "A/R", which is the VSWR "Γ" without interference. It is assumed that there is no phase correlation between the interference signal 131 "Intf" and the "R" signal 117 and it is assumed that the interference has a substantially constant magnitude. "A/R" will be a constant ratio signal while "Intf/R" will have a constant magnitude but random phase.

The Γ measurement instrument 100 is demonstrated by setting the RF source 109 to 2 GHz with a span of 1 MHz (effectively a measurement at one particular frequency) and by replacing the antenna 107 with another RF source 165 to emulate an interference signal. The RF source 165 is set to output a signal at 2 GHz and 5 dBm. "R" data 159 and "A+Intf" data 163 is acquired by the detector 153 at several time samples and the ratio Γ=(A+Intf)/R can be displayed in graphical form as illustrated in FIG. 3A.

Figure 3A:
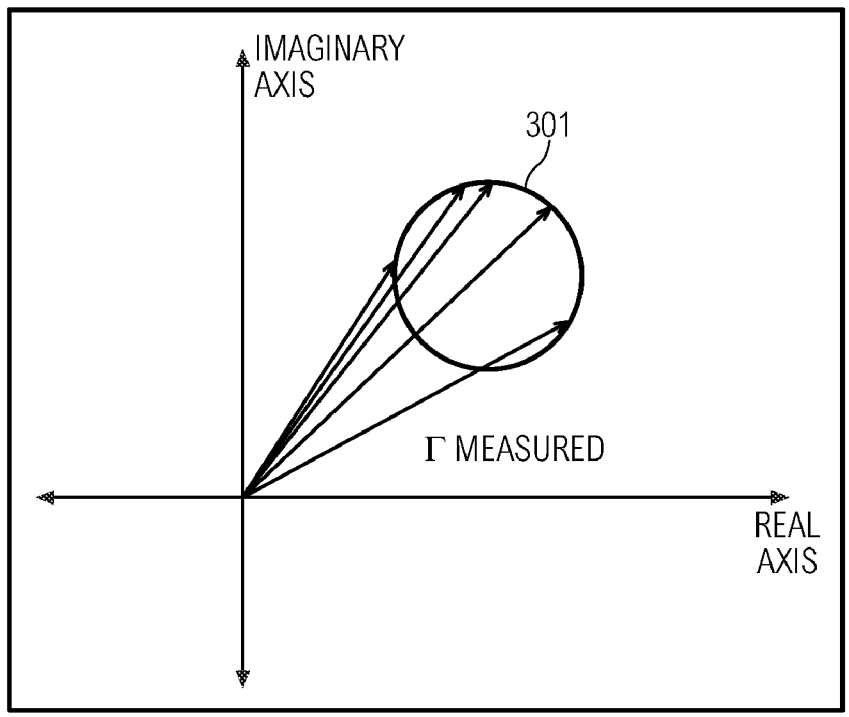
FIG. 3A plots the time samples on the complex VSWR "Γ" plane.

FIG. 3A plots the time samples (five samples in this example) on the complex VSWR "Γ" plane. A complex number such as "Γ" can be viewed as a point or a position vector in a two-dimensional Cartesian coordinate system called the complex plane. The point and hence the complex number "Γ" can be specified by Cartesian (rectangular) coordinates. The Cartesian coordinates of the complex number are the real part x=Re(Γ) and the imaginary part y=Im(Γ). The representation of a complex number by its Cartesian coordinates is called the Cartesian form or rectangular form or algebraic form of that complex number.

Figure 3B:
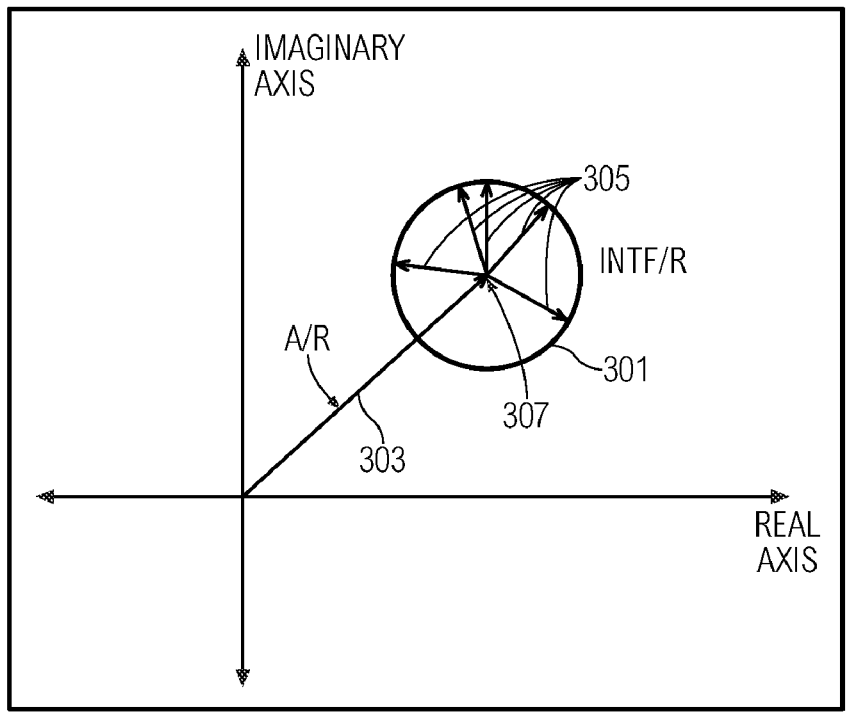
FIG. 3B again plots the time samples on the complex VSWR "Γ" plane and additionally shows that the center of the circle as a desired vector "A/R" representing the VSWR "Γ" without interference and shows the unwanted "Intf/R" vector.

From FIG. 3A it can see that the vector points measured by the Γ measurement instrument 100 trace a circle 301. The vectors are the sum of the constant term "A/R" and the random phase term "Intf/R". FIG. 3B shows that the center of the circle 301 is a desired vector "A/R" 303 representing the VSWR "Γ" without interference while the vector 305 is the unwanted "Intf/R" vector. From time measurement to time measurement, and at a fixed RF source 109 frequency, the "A/R" vector 303 will remain constant while the "Intf/R" vector 305 will rotate around the center of the circle 301, "A/R".

The present invention interpolates the vector points in FIG. 3B and finds the center of the circle 301 to measure the desired "A/R" vector 303.

Linear circle fitting techniques are used to determine the center of the center 307 of the circle 301 in FIG. 3B. In order to accurately determine the center 307, at least three different time samples should be taken allowing for the construction of two chords. For better accuracy in determining the center of the circle 301, it is desirable to take four or more different time samples.

Figure 4A:
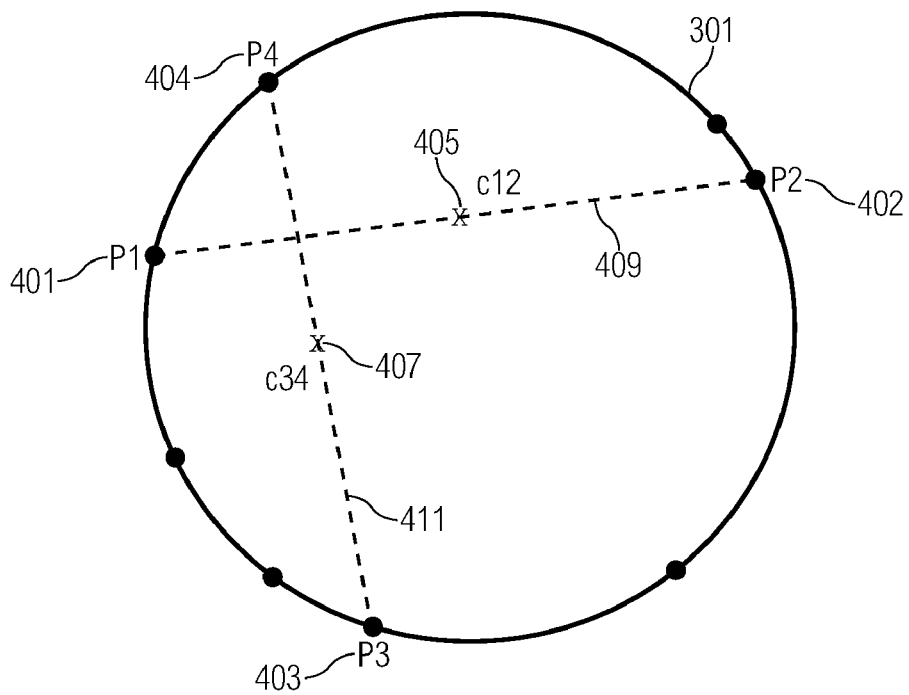
FIGS. 4A and 4B show the vector points from eight different time samples forming the circle of FIGS. 3A and 3B.
Figure 4B:
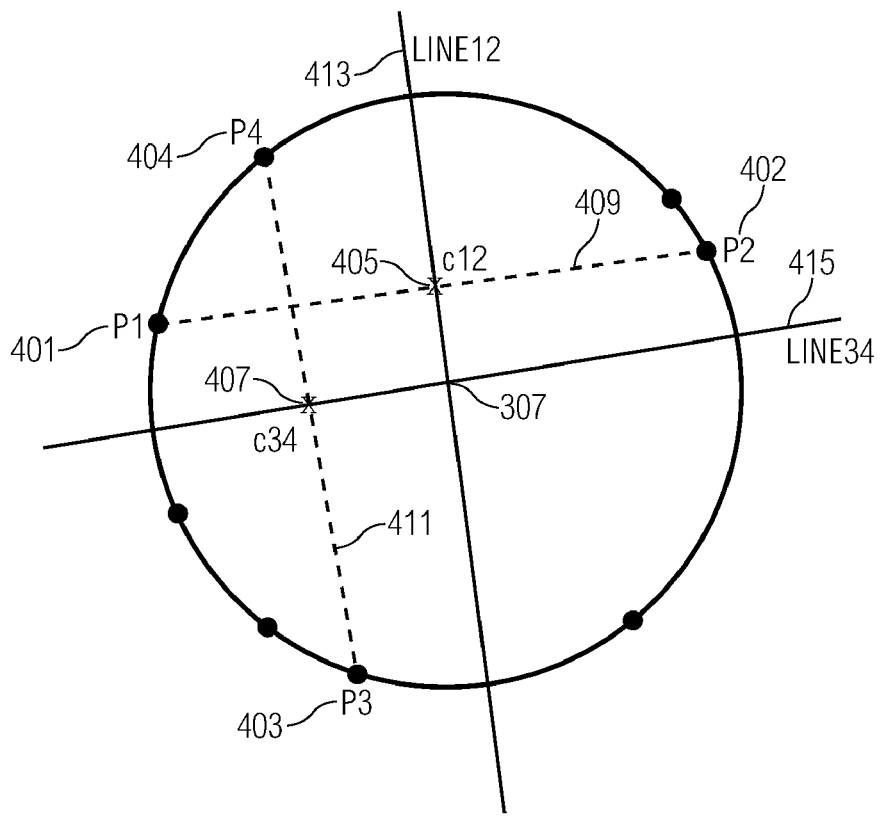

FIGS. 4A and 4B show the vector points from eight different time samples forming the circle 301 of FIGS. 3A and 3B for illustration. The circle 301 best fitting the points of the time samples is calculated.

The processor 155 performs the circle fitting calculations based on the "A+Intf" data 163 and the "R" data 159 stored in the computer readable media 157.

Returning to the flowchart of FIG. 2, the steps of the method for circle fitting and determining the circle center 307 are also illustrated.

At STEP 225 time sample points 401, 402, 403, 404 (or more generally "data points" of time samples or other samples) are selected to give an accurate circle center 307 for the given data. Of course in real situations the time sample points are only approximately on a circle within some error tolerance. In order to increase the accuracy, the points should be separated as far as possible on the circumference of the circle. The best four points can be selected from among the other points as follows:

Point 401: the point having the minimum real part compared to those of all the other measured points.

Point 402: the point having the maximum real part compared to those of all the other measured points.

Point 403: the point having the minimum imaginary part compared to those of all the other measured points.

Point 404: the point having the maximum imaginary part compared to those of all the other measured points.

In order to calculate the circle center 307, at STEP 227 the center point of a chord 409 from Point 401 to Point 402 is determined as the Point 405 (see FIG. 4A). Here a chord is a line that links two points on a circle. Each chord passes between a pair of the data points.

At STEP 229 the center point of a chord 411 from Point 403 to Point 404 is determined as the Point 407.

At STEP 231 the slope of the chords 409, 411 are determined.

At STEP 233 a straight line 413 is modeled having a slope of −1/(slope of the chord 409) and which crosses through Point 405. (see FIG. 4B)

At STEP 235 a straight line 415 is modeled having a slope of −1/(slope of the chord 411) and which crosses through POINT 407. (see FIG. 4B)

At STEP 237 the circle center 307, or "A/R" is determined as the intersection of the lines 413, 415.

Figure 7:
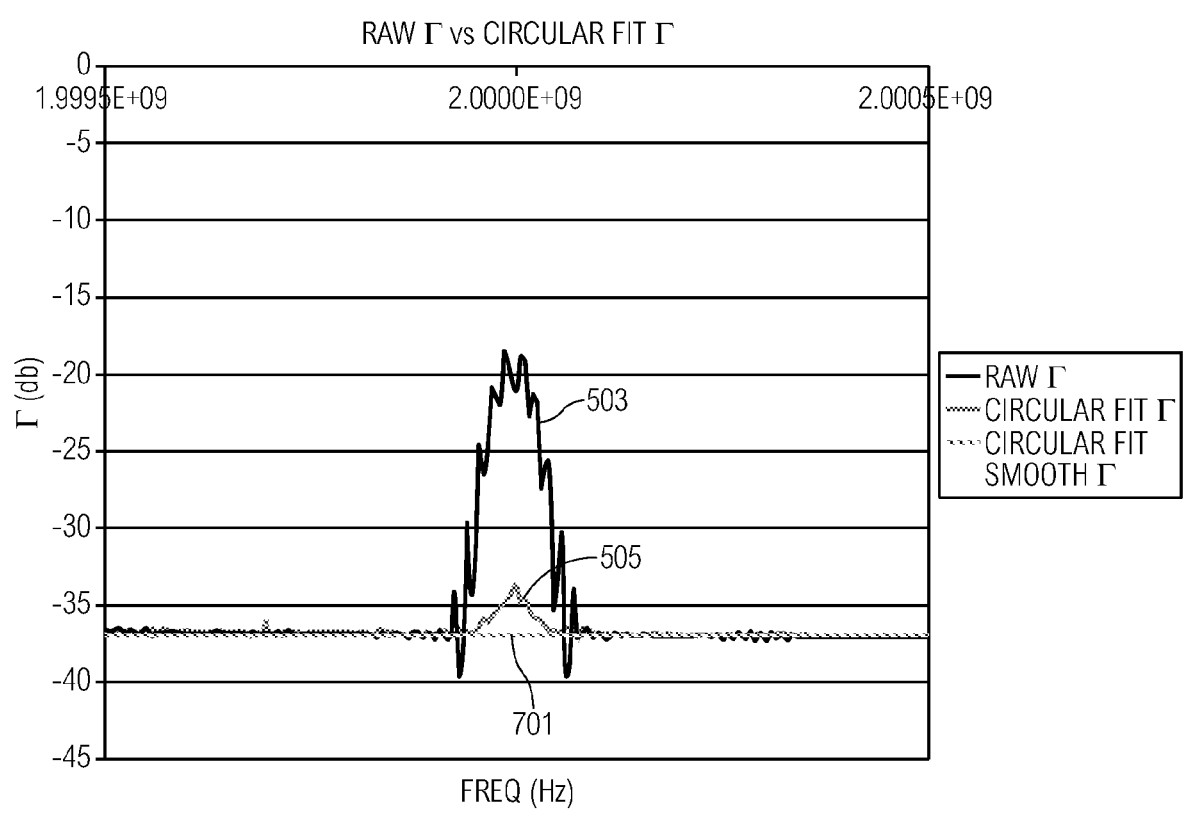
FIG. 7 illustrates the magnitude of the VSWR "Γ" after performing the trace smoothing.

At STEP 238 the processor 155 processes the "A/R" data and outputs the processed data on an output device 238 which might be a computer display for displaying a data in a format such as that shown in FIG. 7. Alternatively the output of the output device 238 can be printed output, audio output or other output.

This method works to determine the center of the circle because the perpendicular bisector of a chord always passes through the center of the circle.

The steps for determining the center of the circle can more generally be stated:

(a) Determine any two chords of the circle.

(b) Determine the perpendicular bisector of one of the chords.

(c) Repeat for the other chord.

(d) The point where the two perpendicular bisector lines intersect is the center of the circle.

Figure 5:
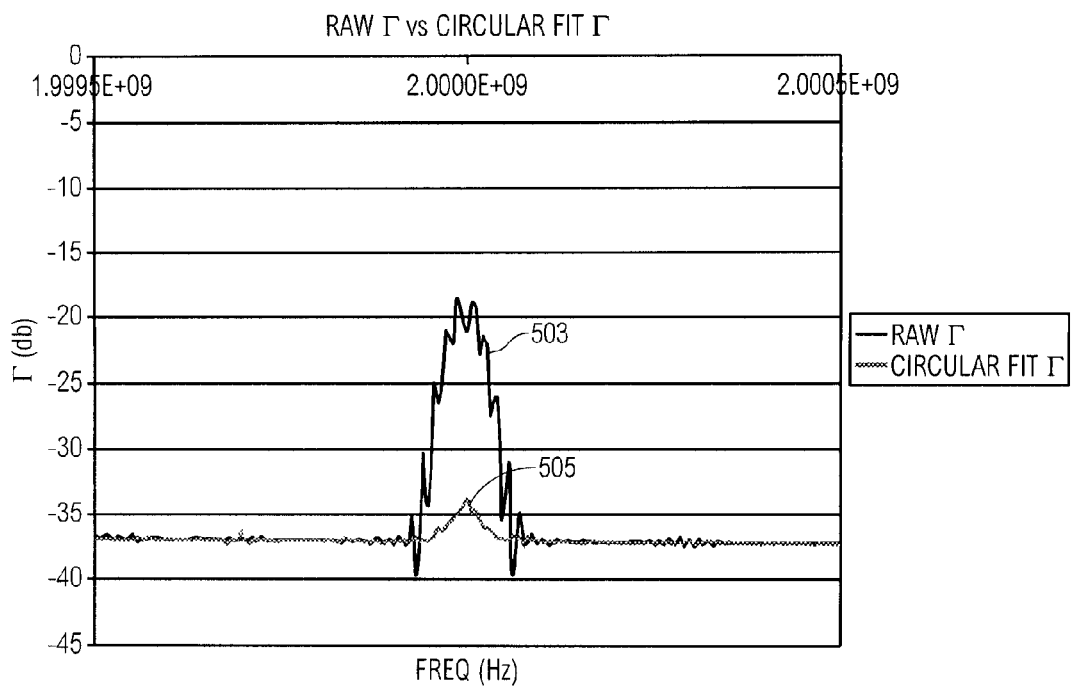
FIG. 5 compares the data for the amplitude of the VSWR "Γ" with and without the circle fitting.

FIG. 5 compares the data for the amplitude of the VSWR "Γ" without the circle fitting STEPS 225-237 and FIGS. 3, 4 as illustrated by the trace 503 and with the circle fitting STEPS 225-237 as illustrated by the trace 505. The interference effect has been reduced significantly and the remaining small bump on the trace 505 is due to a hardware limitation of the mixer 129 causing third order products. This small bump can be decreased by performing trace-smoothing steps of the present invention.

Figure 6A:
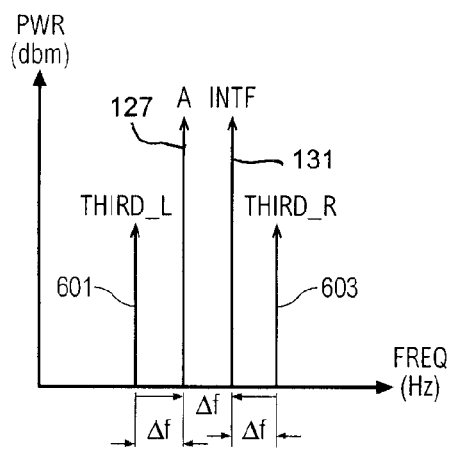
FIGS. 6A and 6B illustrate the effects of third-order products.

The third order products can be caused by the Δf (frequency difference) between the "A" signal 127 and the interference signal 131 ("Intf") illustrated in FIG. 6A. This effect becomes significant when the power level of the interference signal 131 ("Intf") is relatively high. When the signals hit the reflected-channel mixer 129, third order products Third_L 601 and Third_R 603 spaced by Δf are generated.

When the "A" signal 127 and the "Intf" signal 131 are spaced closely enough so that all the frequency spectrum encompassing the Third_L 601, the "A" signal 127, the "Intf" signal 131, and the Third_R 603 lies within the measurement bandwidth (the bandwidth of the digital filter 149), then the circle fitting will degrade. This degradation is because instead of having just two components in the measured VSWR "Γ", there will be four components given by:

$$\Gamma=(A/R)+(Intf/R)+(Third\_L/R)+(Third\_R/R)$$

Note that the system bandwidth of the Γ measurement instrument 100 is centered around the frequency of the "A" signal 127. When the system bandwidth is wide, all four of the above VSWR "Γ" terms will be measured. As the system bandwidth is reduced, only three of the terms might be measured, for example the terms "A/R", "Intf/R" and "Third_L/R". If the system bandwidth is further reduced then only two of the VSWR "Γ" might be measured, for example "A/R" and "Intf/R".

Figure 6B:
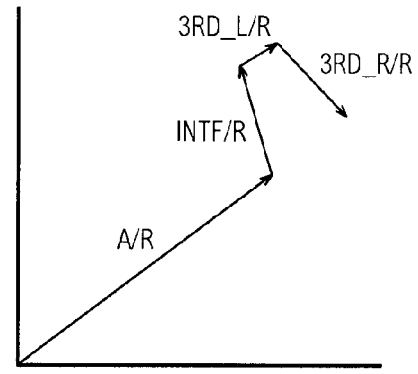

The sum of these four vectors, or three of the four vectors, from time sample to time sample will not trace a circle as in FIG. 3B. Rather, the vectors on the complex plane will appear as shown in FIG. 6B. To solve this problem, trace smoothing steps of the present invention are performed.

At STEP 239 linear fit trace smoothing is performed by the processor 155 on the bump of the trace 505 of FIG. 5 to eliminate the small bump. Linear fit trace smoothing carries out lowpass filtering on the trace 505 to eliminate sharp edges. The trace 701 of FIG. 7 illustrates the magnitude of the VSWR "Γ" after performing the trace smoothing STEP 243 and the bump has been substantially eliminated. The trace 701 can be displayed on an output device 167 of the Γ measurement instrument 100, as can other outputs of the instrument 100 for displaying to a user.

Figure 8A:
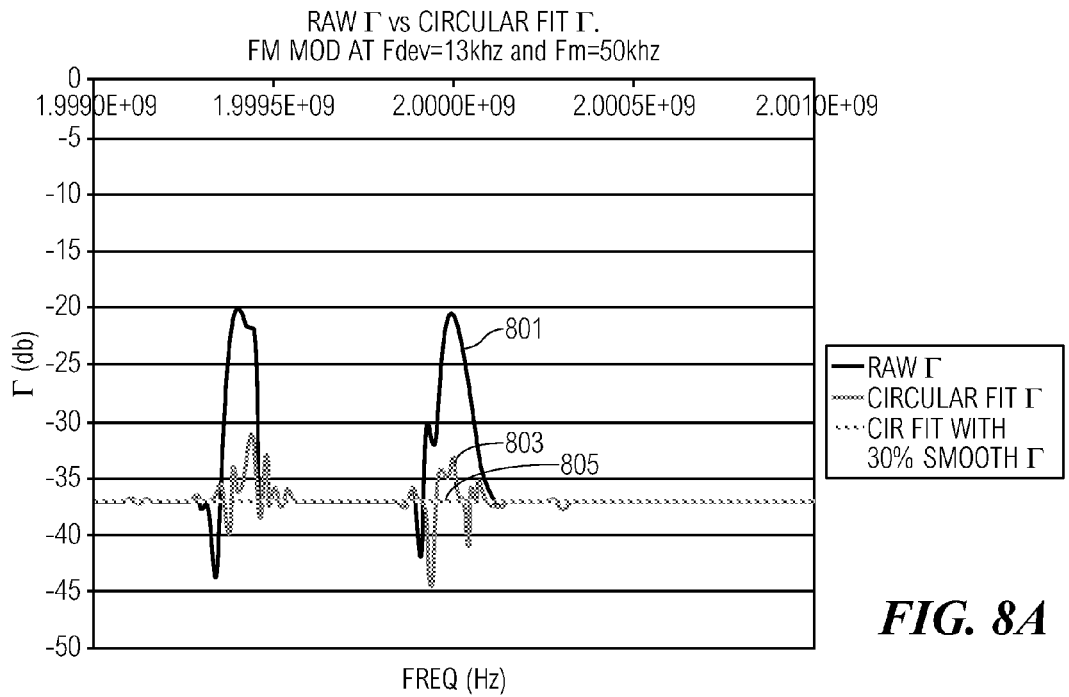
FIG. 8A shows a comparison between uncorrected VSWR "Γ" data, circular fit without smoothing VSWR "Γ" data and circular fit with trace smoothing VSWR "Γ" data for FM modulated interference.
Figure 8B:
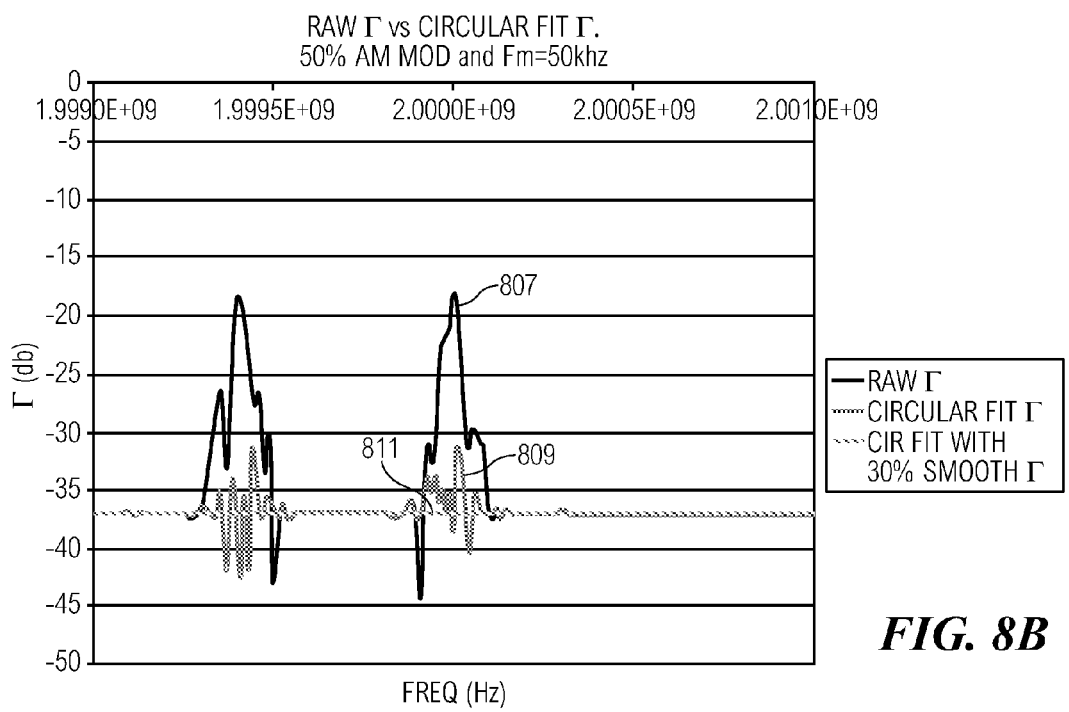
FIG. 8B shows a comparison between uncorrected VSWR "Γ" data, circular fit without smoothing VSWR "Γ" data and circular fit with trace smoothing VSWR "Γ" data for AM modulated interference.

The interference rejection of the present invention using the circle fitting STEPS 225-237 and using the trace smoothing of the STEP 239 will also work for modulated interference. If the interference does not have a substantially constant magnitude (for example in AM modulated interference), the circle fit will degrade. However, the trace smoothing of the STEP 239 will help to overcome this. FIGS. 8A, 8B show the effectiveness of these techniques on FM modulated and AM modulated interference, respectively. FIG. 8A shows a comparison between uncorrected VSWR "Γ" data 801, circular fit without smoothing VSWR "Γ" data 803 and circular fit with trace smoothing VSWR "Γ" data 805. The interference is an FM modulated signal with Fdev=13 kHz and Fm=50 kHz. FIG. 8B shows a comparison between uncorrected VSWR "Γ" data 807, circular fit without smoothing VSWR "Γ" data 809 and circular fit with trace smoothing VSWR "Γ" data 811. The interference is an AM modulated signal with mod=50% and Fm=50 kHz.

Figure 9A:
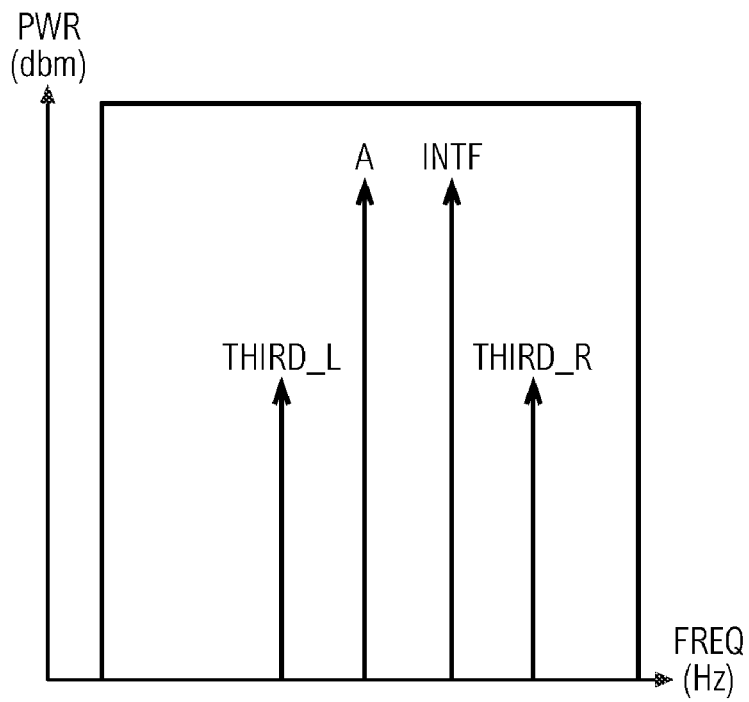
FIGS. 9A and 9B show the principal of the measurement bandwidth reduction.
Figure 9B:
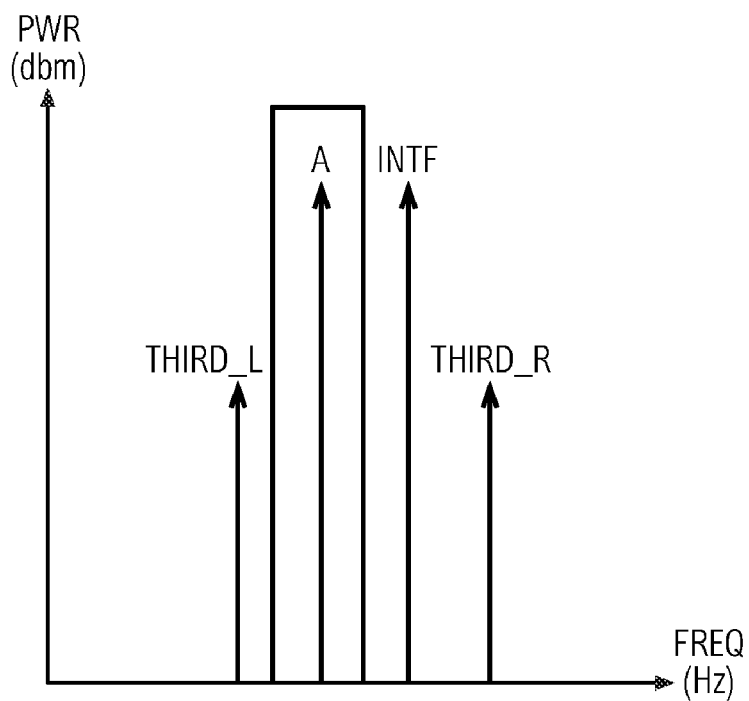

In addition or alternatively to the trace fitting of STEP 239 for reducing the small bump on the trace 505 of FIG. 5 caused by third order products, a STEP 241 can be performed in which a measurement bandwidth reduction step of the present invention is performed. Reducing the measurement bandwidth enables the "A" signal 127 and the "Intf" signal 131 to be closer together in frequency (have a smaller Δf as illustrated in FIG. 6A), without 'degrading' the circle fitting STEPS 225-237. FIG. 9 shows the principal of the measurement bandwidth reduction. FIG. 9A shows the frequency spectrum encompassing the Third_L 601, the "A" signal 127, the "Intf" signal 131, and the Third_R 603 lies within the measurement bandwidth (the system bandwidth or the bandwidth of the digital filter 149). In FIG. 9B, however, the bandwidth of the digital filter 149 is reduced (possibly under the control of the processor 155) so that only the frequency spectrum encompassing the "A" signal 127, and not the Third_L 601, the "Intf" signal 131, or the Third_R 603, lies within the measurement bandwidth.

An adaptive interference rejection STEP 243 of FIG. 2 is performed by the processor 155 and can also be used to increase the speed of the present invention. To have accurate circle fitting in STEPS 225-237, a minimum of three time sample points well separated around the circle are required for each frequency of the RF source 109. To have higher confidence, more time sample points are desirable. For example, eight or more time samples are desirable. If interference rejection, including the circle fitting STEPS 225-237, linear fit trace smoothing STEP 239, and measurement bandwidth reduction STEP 241 are done at every frequency point (in other words at multiple center frequencies and at multiple times for each of the multiple center frequencies) then the sweep time for measuring the VSWR "Γ" is eight times slower than necessary. It would be desirable to optimize the sweep time.

The adaptive mode of STEP 243 first takes "N" time sample measurements at each of the measured frequency points over the frequency sweep of the RF source 109. For example, the frequency sweep might be from 2 MHz to 6 GHz. This is a preliminary sweep of the measurement frequency band and time to obtain preliminary data points. Once all "N" samples are taken, the peak-to-peak deviation or standard deviation is calculated for the samples at each of the frequency points. If the peak-to-peak deviation or standard deviation equals or exceeds a threshold value, then the circle fitting STEPS 225-237 of the present invention are performed on that frequency point. Otherwise, if the peak-to-peak deviation or standard deviation is below the threshold value then the circle fitting steps will not be performed on that frequency point thus saving the processing time of performing the circle fitting STEPS 225-237 and/or linear fit trace smoothing STEP 239 and/or measurement bandwidth reduction STEP 241. When the frequency sweep is from 2 MHz to 6 GHz, typically only a few percent of the frequency span is effected by the interference. The adaptive mode implements the interference rejection only on the effected band, thus optimizing the sweep time. In other words, the adaptive mode determines an adapted frequency band within which the interference component effects the preliminary data points to cause a variation of the preliminary data points greater than a threshold value and performs calculations to remove the interference component only on data points within the adapted frequency band.

In the foregoing specification, the invention has been described with reference to specific exemplary embodiments thereof. The specification and drawings are, accordingly, to be regarded in an illustrative sense rather than a restrictive sense.

The invention claimed is:

1. An apparatus for measuring electrical signals comprising:
   a receiver chain for measuring an electromagnetic wave having an interference component at multiple times to obtain data points;
   one or more processors for calculating the positions of the data points on a complex plane and for calculating a center of a circle approximately fit to the positions, the position of the center on the complex plane representing the electromagnetic wave with the interference component removed; and
   an output device for displaying an indication of the measured electromagnetic wave having the interference component removed.

2. The apparatus of claim 1, wherein the measuring is performed to determine the complex standing wave ratio of the electromagnetic wave.

3. The apparatus of claim 2, wherein the one or more processors are additionally for calculating chords of the circle and for using the chords to calculate the center of the circle.

4. The apparatus of claim 3, wherein the one or more processors use the chords to calculate the center of the circle by:
- calculating the center points of chords of the circle;
- calculating the perpendicular bisectors the chords; and
- determining the approximate center as the intersection of the perpendicular bisectors.

5. The apparatus of claim 3, wherein the chords pass between pairs of the data points.

6. The apparatus of claim 5, wherein one of the chords passes between a pair of data points consisting of a data point having a minimum real part compared to the other data points and a data point having a maximum real part compared to the other measured points; and
- another of the chords passes between a pair of data points consisting of a data point having a minimum imaginary part compared to the other data points and a data point having a maximum imaginary part compared to the other measured points.

7. The apparatus of claim 1, further comprising a filter and wherein the measurement bandwidth is narrow so as to reduce measured third order products.

8. The apparatus of claim 1, wherein the receiver chain measures the electromagnetic wave at a center frequency.

9. The apparatus of claim 8, wherein the measuring is performed at additional center frequencies and at multiple times for each additional center frequency.

10. The apparatus of claim 9, wherein the output device displays the indication of the measured electromagnetic wave having the interference component removed by:
- plotting the amplitude of the complex standing wave ratio having the interference component removed as a function of frequency for each of the additional center frequencies; and
- performing trace smoothing on the plot to reduce the effect of third order products.

11. The apparatus of claim 9, further comprising a source; wherein the source performs a preliminary frequency sweep of a measurement frequency band over which the measuring is to be done to obtain preliminary data points and performing, for each frequency of the frequency sweep, multiple time sweeps to obtain preliminary data points;
- wherein the one or more processors determine an adapted frequency band within which the interference component effects the preliminary data points to cause a variation of the preliminary data points greater than a threshold value; and
- wherein the one or more processors perform the calculations to remove the interference component only on data points within the adapted frequency band.

12. The apparatus of claim 8, wherein a measurement bandwidth of the receiver chain is narrowed around the center frequency so as to reduce measured third order products.

13. The apparatus of claim 12, wherein the receiver chain further comprises a filter passing the reflected electromagnetic wave and wherein the measurement bandwidth is set by a bandwidth of the filter.

14. The apparatus of claim 1, wherein the receiver chain performs the measuring to obtain the data points to determine the complex standing wave ratio of the electromagnetic wave.

15. The apparatus of claim 14, wherein the complex plane represents real and imaginary components of the complex standing wave ratio.

16. The apparatus of claim 14, wherein the complex standing wave ratio represents a measurement of the ratio of a reflected electromagnetic wave and an incident electromagnetic wave.

17. The apparatus of claim 1, wherein the electromagnetic wave is the sum of an electromagnetic wave incident into a device under test (DUT), an electromagnetic wave reflected from the DUT, and an interference component.

18. The apparatus of claim 1, wherein the measurements are made at three or more different times and the positions of at least three data points are calculated on the complex plane.

* * * * *